US012494340B2

(12) United States Patent
Berney

(10) Patent No.: US 12,494,340 B2
(45) Date of Patent: Dec. 9, 2025

(54) CATHODOLUMINESCENCE ELECTRON MICROSCOPE

(71) Applicant: ATTOLIGHT AG, Lausanne (CH)

(72) Inventor: Jean Berney, Lausanne (CH)

(73) Assignee: ATTOLIGHT AG, Lausanne (CH)

( * ) Notice: Subject to any disclaimer, the term of this patent is extended or adjusted under 35 U.S.C. 154(b) by 974 days.

(21) Appl. No.: 17/610,068

(22) PCT Filed: May 11, 2020

(86) PCT No.: PCT/EP2020/063093
§ 371 (c)(1),
(2) Date: Nov. 9, 2021

(87) PCT Pub. No.: WO2020/225453
PCT Pub. Date: Nov. 12, 2020

(65) Prior Publication Data

US 2022/0216028 A1 Jul. 7, 2022

Related U.S. Application Data

(60) Provisional application No. 62/845,722, filed on May 9, 2019.

(51) Int. Cl.
*H01J 37/141* (2006.01)
*H01J 37/147* (2006.01)
(Continued)

(52) U.S. Cl.
CPC ........ *H01J 37/141* (2013.01); *H01J 37/1475* (2013.01); *H01J 37/228* (2013.01); *H01J 2237/141* (2013.01); *H01J 2237/2808* (2013.01)

(58) Field of Classification Search
CPC .... H01J 37/141; H01J 37/1475; H01J 37/228; H01J 2237/141; H01J 2237/2808; H01J 2237/1405; H01J 37/1474; H01J 37/28
See application file for complete search history.

(56) References Cited

U.S. PATENT DOCUMENTS 4,393,311 A * 7/1983 Feldman ................ G01N 21/62 850/10
4,567,368 A * 1/1986 Wells ..................... G01N 30/70 250/386
(Continued)

FOREIGN PATENT DOCUMENTS

| | | | |
|---|---|---|---|
| DE | 2309181 | A1 | 10/1973 |
| FR | 2173436 | A5 * | 2/1972 |
| WO | 2020104975 | A1 | 5/2020 |

OTHER PUBLICATIONS

Alaruri, Sami. (2018) . 45.5X infinity corrected Schwarzchild microscope objective lens design: optical performance evaluation and tolerance analysis using Zemax. International Journal of Measurement Technologies and Instrumentation Engineering. 7. 17-37. 10.4018/IJMTIE.2018010102.*
(Continued)

*Primary Examiner* — Robert H Kim
*Assistant Examiner* — Laura Eloise Tandy
(74) *Attorney, Agent, or Firm* — WOMBLE BOND DICKINSON (US) LLP

(57) ABSTRACT

A scanning electron microscope having an electron column positioned to direct an electron beam onto a sample the electron column having a vacuum enclosure; an electron source; and an electromagnetic objective lens positioned within the vacuum enclosure, the electromagnetic objective lens including a housing having an entry aperture at top surface thereof and an exit aperture at bottom thereof; an electromagnetic coil radially positioned within the housing; a light objective positioned within the housing and comprising a concave minor having a first axial aperture and a convex minor having a second axial aperture; an electron beam deflector positioned within the housing and comprising a first set of deflectors and a second set of deflectors positioned below the first set of deflectors, wherein the
(Continued)

second set of deflectors is positioned below the first axial aperture and the first set of deflectors is positioned above the second set of deflectors.

22 Claims, 8 Drawing Sheets

(51) Int. Cl.
*H01J 37/22* (2006.01)
*H01J 37/28* (2006.01)

(56) References Cited

U.S. PATENT DOCUMENTS

| | | | | |
|---|---|---|---|---|
| 4,990,776 | A | 2/1991 | Fushim | |
| 6,452,175 | B1 | 9/2002 | Adamec | |
| 8,648,301 | B2 | 2/2014 | Bean | |
| 2008/0111084 | A1* | 5/2008 | Benas-Sayag .......... | H01J 37/12 216/94 |
| 2009/0179161 | A1* | 7/2009 | Ward ...................... | H01J 37/08 250/424 |
| 2018/0226221 | A1 | 8/2018 | Danilato | |
| 2019/0311882 | A1* | 10/2019 | Hendriksen ........... | H01J 37/261 |

OTHER PUBLICATIONS

English Translation of Conty (Year: 1972).*
Anonymous, “Allalin—Blazing fast quantitative CL”, Jul. 1, 2018 (Jul. 1, 2018), p. 1-6.
International Search Report for PCT/EP2020/063093, Nov. 20, 2020, 4 pages.
Written Opinion for PCT/EP2020/063093, Nov. 20, 2020, 11 pages.
International Preliminary Report on Patentability Chapter I for PCT/EP2020/063093, Nov. 2, 2021, 12 pages.

* cited by examiner

CATHODOLUMINESCENCE ELECTRON MICROSCOPE

RELATED APPLICATIONS

This Application claims priority benefit from U.S. Provisional Application Ser. No. 62/845,722, filed May 9, 2019, the disclosure of which is incorporated herein by reference in its entirety.

TECHNICAL FIELD

The present invention relates to scanning electron microscopes comprising an electromagnetic lens. In particular, but not exclusively, it relates to scanning cathodoluminescence microscopes. The invention likewise relates to a measurement arrangement and to a method of operating the above microscope.

BACKGROUND

An electron microscope, as opposed to a light microscope, is a microscope that uses accelerated electrons as a source of illumination. Because the wavelength of an electron can be up to 100,000 times shorter than that of visible light photons, the electron microscope has a higher resolving power than a light microscope and can reveal the structure of smaller objects.

A scanning electron microscope (SEM) is one type of electron microscope that produces images of a sample by scanning the sample with a focused beam of electrons. The electrons interact with atoms in the sample, producing various signals that can be detected and that contain information about the sample's surface topography, structure and composition. The electron beam is generally scanned in a raster scan pattern, although other scanning techniques may also be used, and the beam's position is combined with the detected signal to produce an image. SEMs can achieve resolution better than 1 nanometre. The types of signals produced by an SEM include secondary electrons (SE), back-scattered electrons (BSE), characteristic X-rays, light (cathodoluminescence, CL), specimen current and transmitted electrons (TEM).

The light emitted by a specimen upon electron bombardment is called cathodoluminescence. Cathodoluminescence measurements can be performed in a scanning electron microscope by scanning the highly focused electron beam probe of the electron microscope over the surface of the specimen and recording the cathodoluminescence signal intensity as a function of the electron beam position on the specimen. A cathodoluminescence map may be generated, which provides higher resolution spectroscopic information than would a wide field light optical image obtained by a light microscope.

Usually, the alignment of the electron microscope is performed in secondary electron mode. In this mode, the intensity of the electrons extracted upon bombardment of the specimen (secondary electrons) is recorded as a function of the electron probe position. The contrast of the secondary map is mostly related to the surface morphology of the specimen. Secondary electron maps can be generated in real time and can be used to minimize the probe size of the electron microscope. Cathodoluminescence maps are preferably measured after the probe size has been minimized.

Today, most commercial cathodoluminescence measurement solutions are third party add-ons to existing electron microscopes. They consist of at least a light collection means and a light detector. FIG. 1 illustrates schematically a portion of a cross-section of a conventional electron microscope. The first element of a collection optic 3 for redirecting a light beam 4 is usually a parabolic or elliptical reflector (mirror), inserted between a last electromagnetic lens 5 of the electron optical column, known as the electron objective lens, and a sample 7, also known as a specimen 7. The collection optic comprises a central aperture for the electron beam 9 to pass through it. The focal point of the parabolic reflector 3 coincides with the focal point of the electron beam on the sample. The drawback of such a system is threefold:

Firstly, the reflector 3 has to be large in order to maintain good optical and mechanical performance, such as high reflectivity, good wave-front uniformity, large field of view and good mechanical stability. The larger the reflector, the larger the working distance, i.e. the distance between the sample 7 and the last lens 5 of the electron microscope. However, electron optics achieves a smaller electron beam probe at a shorter working distance (a few millimetres). Therefore, a trade-off has to be found between a small electron beam probe size on the one hand and a good optical and mechanical performance of the cathodoluminescence detection on the other.

Secondly, the reflector 3 screens or blocks the electrical field which serves to extract the secondary electrons, and thereby prevents an optimal collection of secondary electrons. This reduces the signal to noise ratio in secondary electron mode, makes the optimization of the electron probe size more difficult and degrades the best spatial resolution that can be achieved.

Thirdly, the field of view of a parabolic/elliptical reflector used in common cathodoluminescence collection systems is limited to a few micrometres. The field of view corresponds to the region around the focal point of the reflector that can be imaged onto a detector without losing light. Consequently, in order to acquire a cathodoluminescence map without losing light, the sample must be positioned at the focal point with great precision, and the electron probe must scan the specimen within the field of view of the reflector. However, it is very difficult to position the specimen at the focal point of the reflector and, at the same time, make sure that the electron probe has an optimal size and scans the right area. A tedious, recurrent alignment is required, which is only practicable if the specimen emits a great deal of light. In practice, such repetitive work cannot be performed properly, and the collection efficiency is reduced. Medium and large area scans (more than a few micrometres) are plagued with significant inhomogeneity of collection efficiency (vignetting), and quantitative cathodoluminescence maps cannot be produced.

Most of the above mentioned problems can be solved by using a compound reflective objective comprising one concave, one convex and one planar mirror as schematically illustrated in FIG. 2. This is a known solution in the field of electron beam probe microscopy, where a reflective objective is used to image the surface of the specimen. In most implementations, a Cassegrain-like reflective objective is used. A Cassegrain-like reflective objective consists of two spherical mirrors positioned so that they offer a much larger field of view than a single parabolic or elliptical mirror. A large concave spherical mirror M1 is placed above the specimen, so that it reflects the light coming from the specimen towards a small convex spherical mirror M2 placed in between the sample and M1. The mirror M2 is arranged to redirect the light along the optical axis of the electromagnetic objective lens 5, and a planar mirror M3 redirects the light beam towards an output. All the three mirrors M1, M2 and M3 feature a hole for the passage of the electron beam path so that the electron beam is not obstructed.

The working distance of the Cassegrain-like reflective objective is large so that it can fit within the electron objective lens 5 of the electron microscope. The field of view is significant (typically a few hundred micrometres) and the arrangement can be used as an optical microscope objective. Since there is no mirror below the electron objective lens, secondary electrons are not screened, and the working distance can be as short as required to reach high spatial resolution (small electron probe size).

Yet, this solution has mostly been used for imaging a sample that is illuminated with a bright light source. It was not suitable for measuring weak cathodoluminescence signals where only a few photons are emitted per second or per minute. As such, the numerical apertures (NAs) of the reflective objectives in use today are low (typically below 0.3) and are not suitable for high collection efficiency in low light intensity conditions. Notably, it has not been disclosed how to embed a high numerical aperture reflective objective (NA>0.4) within the electron objective lens of a scanning electron microscope, while maintaining the capability to scan large specimen areas.

For further disclosures of systems incorporating light collection into a particle beam column, the reader is referred to: U.S. Pat. No. 3,845,305, U.S. Pub. Nos. 2013/0335817 and 2019/0103248, and French Pat. No. 2173436. One issue attempted to be addressed by these disclosures is how to incorporate all of the various particle and light optical elements in a small area so as to enable short working distance. For example, U.S. Pub. 2019/0103248 and FR 2173436 place the optical elements below the electromagnetic elements. However, this leads to a relatively large working distance, enabling beam expansion due to mutual repulsion of the electrons within the beam.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

It is an aim of the present invention to overcome the problems identified above related to scanning electron microscopes. In particular, it is the aim of the present invention to show how a high numerical aperture reflective objective can be integrated within an electromagnetic electron objective lens of a scanning electron microscope without degrading the electron microscope performances including space resolution, field of view, etc.

According to a disclosed aspect, there is provided an integrated quantitative cathodoluminescence scanning electron microscope, wherein light optical elements are positioned coaxially within the space occupied by electromagnetic optical elements.

In disclosed embodiments, collection mirrors are positioned within an electromagnetic objective lens of the electron column. Each collection mirror has a central aperture to enable passage of the electron beam. Beam scanning elements are also placed within the electromagnetic objective lens. The beam scanning elements are placed within the "shadow" of the collection mirrors, so as not to interfere with light collection. In some instances, some or all of the beam scanning elements may be placed, at least partially, within one or both apertures of the collection mirrors.

The disclosed embodiments are advantageous in that the electron beam deviating means (beam scanning element) can be placed very close to the sample, enabling the scanning area to be increased compared to traditional scanning electron microscopes. Also, the beam scanning elements are positioned in the microscope so that they do not create any further obstruction to the light. By ensuring that the electron beam passes through the center of the electromagnetic objective lens, located at the intersection of the optical axis of that lens and a location where the generated magnetic field has its largest value, any optical aberrations due to the scanning of the sample can be minimized.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

Other features and advantages of the invention will become apparent from the following description of non-limiting exemplary embodiments, with reference to the appended drawings, in which.

DETAILED DESCRIPTION

Figure 1:
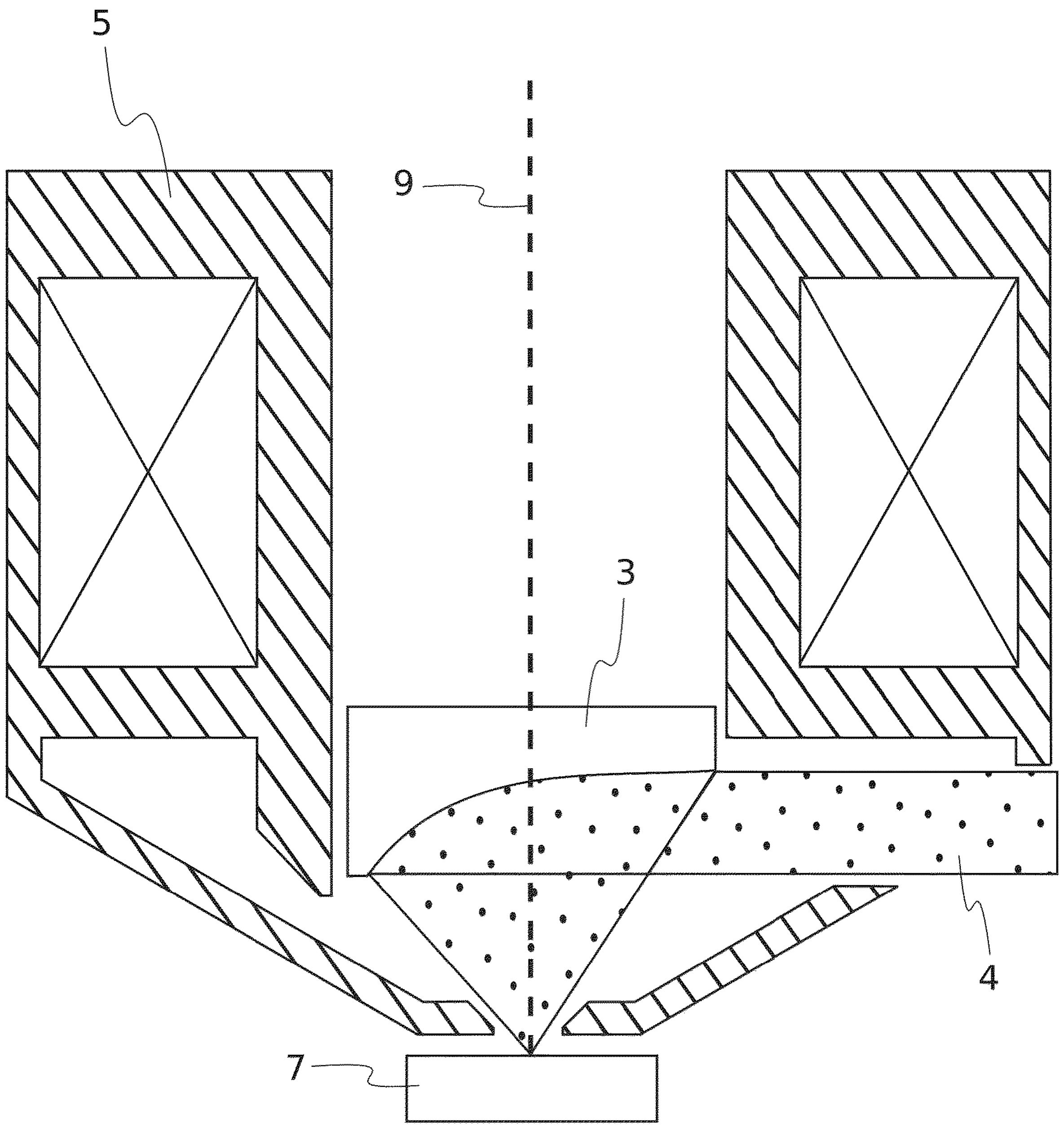
FIG. 1 is a schematic cross-sectional view of a lower portion of an electron microscope according to prior art.
Figure 2:
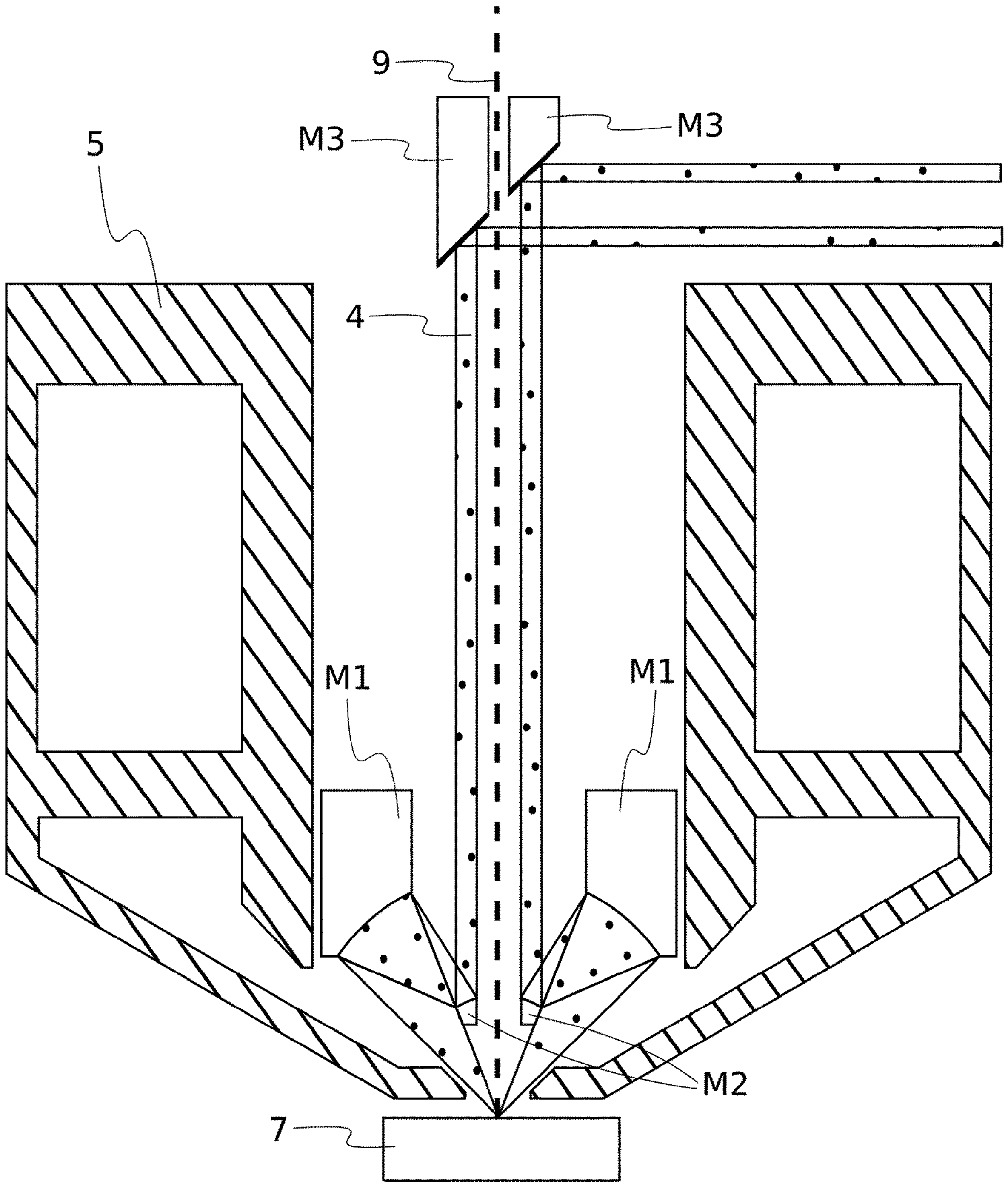
FIG. 2 is a schematic cross-sectional view of a lower portion of another electron microscope according to prior art.

Some embodiments of the present invention are described below in more detail with reference to the attached figures. Identical functional and structural elements which appear in the different drawings are assigned the same reference numerals.

Embodiments of the inventive cathodoluminescence scanning electron microscope will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments, even if such are not explicitly described herein.

Figure 3:
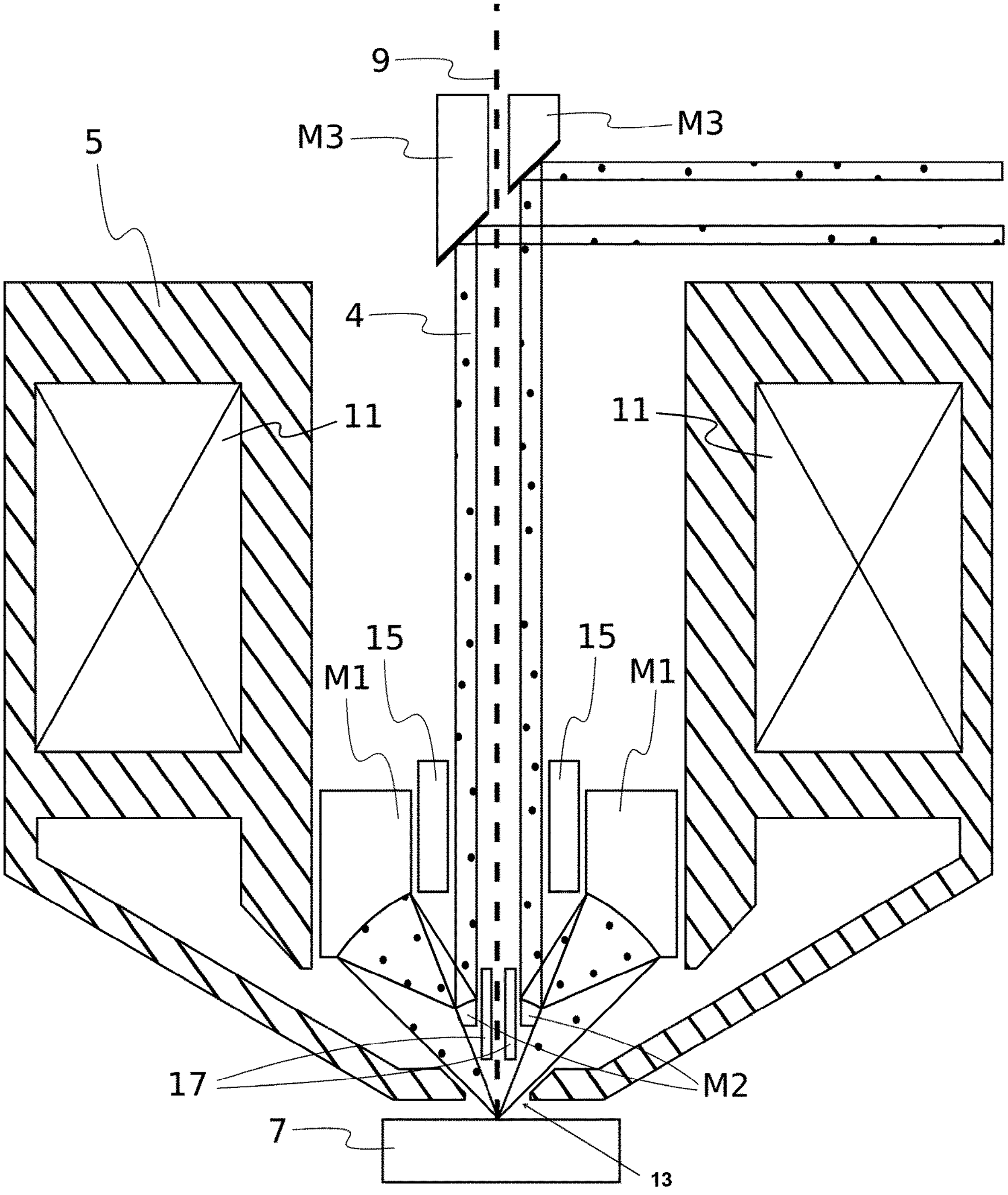
FIG. 3 is a schematic cross-sectional view of a lower portion of a cathodoluminescence scanning electron microscope according to one embodiment.
Figure 4:
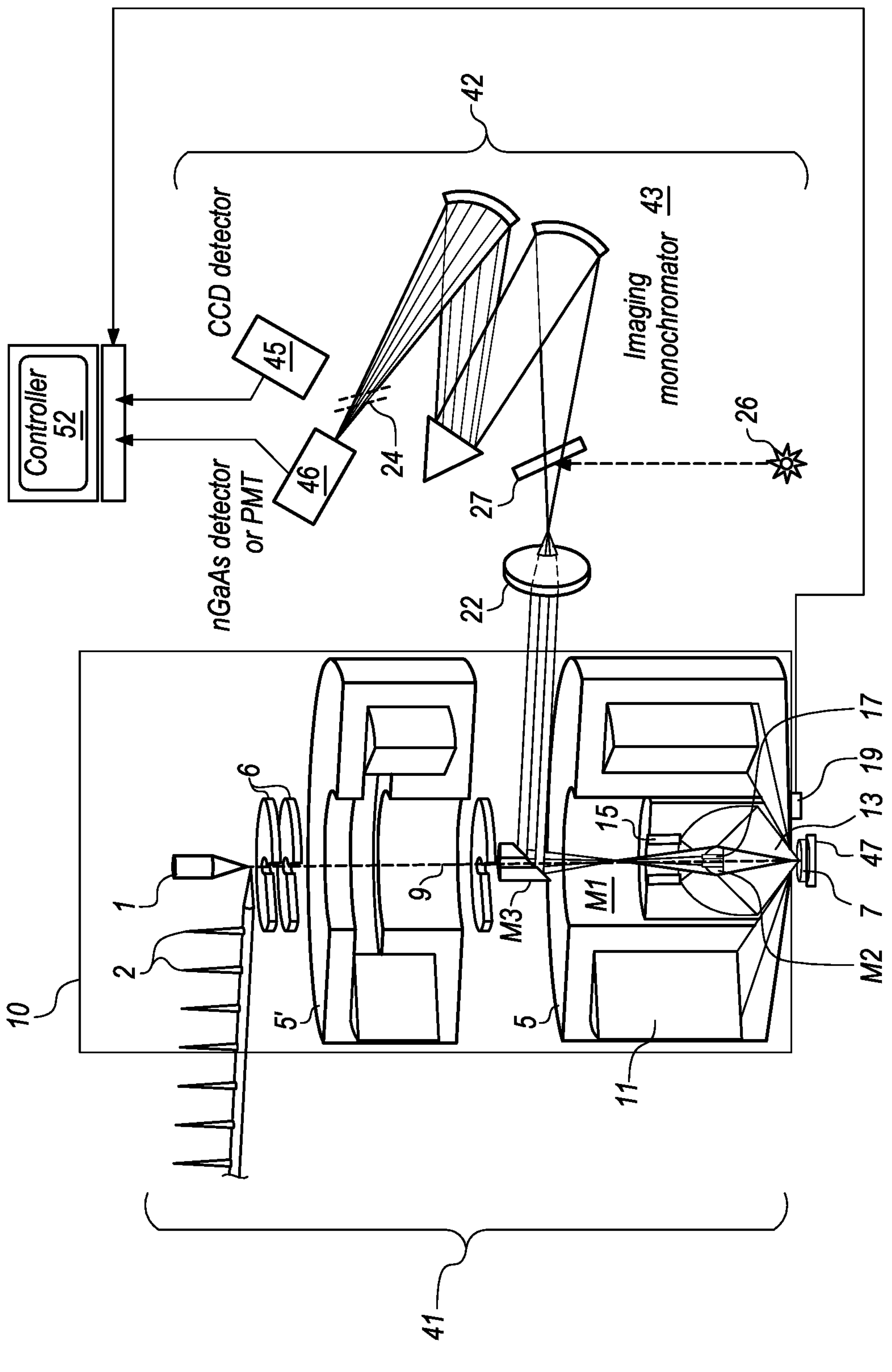
FIG. 4 is a cross-section of an integrated quantitative cathodoluminescence scanning electron microscope according to an embodiment.

FIG. 3 shows a cross-sectional view of a lower portion of a cathodoluminescence scanning electron microscope together with a sample or specimen 7. FIG. 4 shows a lower portion of similar microscope in cross-sectional view. As illustrated in FIG. 4, the microscope generally includes an electron column 41 that is housed within vacuum enclosure 10, and imaging elements 42, which are in atmospheric environment. The integrated microscope shown in FIG. 4 can generate an electron beam image, a light beam image, a cathodoluminescence (CL) image, and a CL spectrographic image. The imaged CL emissions can be correlated to the structure and quality of the sample's material at the nanoscale. The CL data can reveal material stress, impurities, crystallographic, and subsurface defects that are not visible using other imaging modes. Importantly, the CL imaging is a non-destructive method of inspecting a sample.

The electron column includes an electron source 1, such as a thermionic or field emission source, that emits electrons. The emitted electrons are made into electron beam 9 by the various particle-optics elements, such as electromagnetic lens 5', electromagnetic objective 5, and aperture disks (sometimes referred to as stops) 6. Note that any of the aperture disks 6 may function as an electrostatic lens by application of potential thereto. In FIG. 4, pulses 2 indicate that in this particular example the electron emission from the source 1 is done in pulses, but this is not necessarily so. For example, emission may be done continuously or shutters may be used to generate intermittent emission.

The electromagnetic objective lens 5, also referred to simply as an electromagnetic objective, is shown in more details in FIG. 3. In a known manner, coils 11 are provided to generate a magnetic field, in this figure a substantially horizontal magnetic field at the level of the optical axis z (FIGS. 6*a* to 6*d*) of the electromagnetic objective lens 5. Most of the magnetic field may be located at the level of an output or exit aperture 13, or instead it could be outside of that region between the lens and the specimen. As the electromagnetic objective lens 5 may be considered to be a thick lens, it has a first principal plane and a second principal plane. In the illustration of FIG. 3, the first principal plane would be the upper plane, and the second principal plane would be the lower plane. In this configuration it would be the second principal plane where the electron beam rays would be deflected, in other words it is there where the focusing of the electron beam takes place. In the following description, it is assumed that most of the magnetic field is located at the intersection of the second principal plane and the optical axis of the electromagnetic objective lens 5. This intersection point is located axially between the sample 7 and lower end of a first deflector 17 as explained later.

The purpose of the magnetic field is to generate a converging electron beam 9 which can be focused on to the surface of the sample 7. In this example, the electron beam 9, which is generated by the electron emitter 1, propagates from the top of the figure downwards. The electron beam span may be modified by a condenser arrangement, such as a lens 5', so that it can either diverge, be collimated or converge. The condenser means may be placed below the electron emitter. The electron beam typically has a width in the range of a few millimetres, for example between 2 and 3 mm.

The electromagnetic objective lens 5 may be rotationally symmetric along its optical axis, which essentially coincides with the path of the electron beam 9. The electromagnetic objective lens 5 is designed in such a way that the electron beam originating from the source 1 at a finite or infinite distance (collimated beam) that crosses its center, as explained later, will be focused on to a focal plane. The position, and more specifically the height above the sample, of the focal plane can be adjusted by varying the intensity of the magnetic field flowing through the electromagnetic objective lens 5, although the lens is optimized to produce the smallest probe size when the focal plane is placed about 5 mm below the center of the electromagnetic objective lens 5.

The lens 5 has a hollow interior along its optical axis, so that the electron beam 9 can pass through. The hollow part (passage or gap) is wide enough so that light emitted by or reflected from the sample 7, as explained later, can also pass through without much obstruction. Since it is preferable to keep the output aperture 13 of the electromagnetic objective lens 5 as small as possible in order to keep good electron optical performance, it is preferable to build the system so that the working distance stays small.

As can be seen, a reflective objective is provided within the electromagnetic objective lens 5 for imaging the surface of the sample 7. In this example a Schwarzschild reflective objective is used. A Schwarzschild objective is a two mirror reflective objective, which is rotationally symmetric about the optical axis z (essentially coinciding with the path of the electron beam, see FIGS. 6*a* to 6*d*), is aplanatic and infinity-corrected. In the context of geometrical optics, an objective is infinity-corrected if all light rays entering the objective parallel to the optical axis are focused onto the same focal point, forming a diffraction-limited spot, or conversely, all light rays emitted from the focal point and going through the objective form a bundle of light rays, or equivalently a collimated output beam, parallel to the optical axis. The electromagnetic objective lens 5 and the reflective objective may have the same focal plane.

An objective is aplanatic if it satisfies both the Abbe sine law and the Lagrange condition (also called Fermat principle). For an infinity-corrected objective, the Abbe sine law states that a light ray passing through the focal point and forming an angle $\alpha$ with the optical axis will exit the objective parallel to the optical axis and at a distance y' from the optical axis, so that $y'=m\times\sin(\alpha)$, where m is a real constant. This law should be satisfied at least in the vicinity of the focal point. For an infinity-corrected objective, the Lagrange condition states that the optical path followed by the light rays between the focal point and a plane which is orthogonal to the optical axis and placed within the collimated light beam, is constant, whatever the value of the angle $\alpha$.

The advantage of an aplanatic objective can be assessed using the theory of optical aberrations. Aberrations describe the deviation from ideality for an imaging optical system. An ideal imaging optical system is (1) stigmatic and (2) achromatic, i.e. (1) the image of a point, located at finite or infinite distance from the optical system, imaged by the optical system is a point (or more accurately a spot of which size is limited by diffraction of light), and (2) the position of the image point does not depend on the wavelength of light. The effect of aberrations on the imaging properties of an optical system is to deform the diffraction-limited image of a point object. A method (among others) to describe monochromatic aberrations was developed by Seidel. Here, aberrations are classified following their relative importance (as terms of an odd power series) and their effect on the image of a point source through the imaging optical system. The third-order terms of the power series describe the most basic aberrations (known as third-order aberrations) such as spherical and comatic aberrations, astigmatism, field curvature and distortion.

An aplanatic objective is corrected from spherical and comatic aberrations. The spherical aberration affects the image of a point object, independently of the on-axis or off-axis position of the object. On-axis and off-axis should be understood here as the rays that are emitted from an object on the optical axis, and the rays that are emitted from an object that is a distance off of the optical axis, respectively. An objective affected by spherical aberrations focuses the incident light rays at different positions along an axis parallel to the optical axis depending on the angle they make with the optical axis, resulting in a deviation from the otherwise diffraction-limited spot size of the image. Comatic aberration affects the image of a point object when the object is located off-axis. An objective affected by comatic aberrations focuses the incident light rays at different positions in a plane perpendicular to the optical axis depending on the angle they make with the optical axis and the position of the point object relative to the optical axis. The comatic aberration transforms the otherwise diffraction-limited circular symmetric spot into a comatic shaped spot.

There are advantages in working with an infinity-corrected objective. Firstly, because the rays exiting the objective are parallel to the optical axis, the image of the object can be formed at any axial distance along the optical axis, if another lens is added, for example. Secondly, it is possible to add optical elements such as plates, polarizers, spatial and spectral filters without any modification of the image location. A Schwarzschild reflective objective is calculated in such a way that it has the desired optical properties at its focal point. It is also aplanatic, which means that these properties will not change dramatically when departing from the focal point. It will keep a relatively good optical performance over a large field of view (up to a few degrees), i.e. light emitted off-axis from a point within the focal plane will produce an output beam which is nearly collimated. Conversely, a collimated beam entering the objective with a relatively large angle (up to a few degrees) will form a spot on the focal plane, which is relatively small (nearly diffraction-limited).

It is to be noted that the teachings of the invention are also applicable when using non-infinity corrected reflective objectives. For example, the electromagnetic objective would work very well with a Schwarzschild objective with a back focal plane, which focuses things.

As can be seen in FIGS. 3 and 4, the reflective objective within the electromagnetic objective 5 comprises a first mirror M1, also referred to as the primary mirror, which in this example is spherical and concave, and a second mirror M2 also referred to as the secondary mirror, which in this example is spherical and convex. The diameter of the first mirror M1 is larger than the diameter of the second mirror M2. The first mirror M1 is located above the second mirror M2 and is arranged to reflect the light coming from the sample as a result of the electron beam 9 hitting the surface of the sample 7, and to direct the light towards the second mirror M2 placed between the sample and the first mirror M1. The second mirror M2 is arranged to redirect the light along the optical axis of the electromagnetic objective (in FIG. 3 upwards), and a third mirror, M3, which in this example is planar, is arranged to redirect the light beam 4 towards an output, as shown in FIG. 4. In this example the third mirror M3 has a 45° angle with respect to the electron beam 9 axis and is used to redirect the light out of the vacuum enclosure 10. All the three mirrors M1, M2 and M3 have an aperture or opening along the electron beam path so that the electron beam is not obstructed.

The microscope shown in FIGS. 3 and 4, also comprises a first electron beam deviating means 17, referred to as a first deflector element or simply a first deflector 17, and a second electron beam deviating means 15, referred to as a second deflector element or simply a second deflector 15. As can be seen, in the first embodiment illustrated in FIGS. 3 and 4, the first deflector 17 is located at least partly within the aperture of the second mirror M2, while the second deflector 15 is located at least partly within the aperture of the first mirror M1. In other words, the first deflector 17 is located radially inwards from the aperture of the second mirror M2 and at least partially axially coincident with that aperture, while the second deflector 15 is located radially inwards from the aperture of the first mirror M1 and at least partially axially coincident with that aperture. The deflectors 15, 17 are located so that they do not obstruct the propagation of the electron beam 9 or the reflected light beam.

Each deflector may comprise for example four longitudinal electrical conductors (quadrupole), also referred to as electrodes. They may also comprise four magnetic coils (magnetic deflector). However, the number of electrodes or magnetic poles could also be different from four. For example, there might be eight electrodes or magnetic poles (octupole) instead of four, so that the astigmatism of the electron beam could be corrected as well. In this case four of the electrodes or magnetic poles are called stigmators used to correct the astigmatism.

The electron beam characteristics can be affected by the electromagnetic elements along its path. The spherical and chromatic aberrations of the condenser lens 5' that may be positioned after the emitter can limit the quality of beam formation and therefore the spot size. A potentially serious form of astigmatism in the focused spot can result if the diameter of the openings in electron optical elements are not circular, or are displaced or tilted with respect to the optical axis. In these cases, the elliptical shape of the resulting electric or magnetic field will cause an aberration called ellipticity astigmatism. The resulting focused spot will, to first order, be elliptical rather than circular in cross section. This form of astigmatism can be corrected by the use of a stigmator which, in its simplest form is an n-pole element of opposite electronic or magnetic fields arranged around the beam. The same n-pole element may be used to both deflect the beam and correct for astigmatism.

The electrodes are placed along the electron beam trajectory; however, so that they allow the electron beam to pass through the passage in the electromagnetic objective lens 5 and the apertures in the mirrors M1, M2 and M3 without obstructing it. The deflectors are used to deviate the trajectory of the electron beam so that it can be scanned over the surface of the sample 7. The sample 7 is positioned on a sample holder 47 at the focal point or in the focal plane of the electromagnetic objective lens 5 so that the distance from the first deflector 17 to the sample 7 is smaller than twenty times the focal length of the electromagnetic objective lens 5.

Figure 5A:
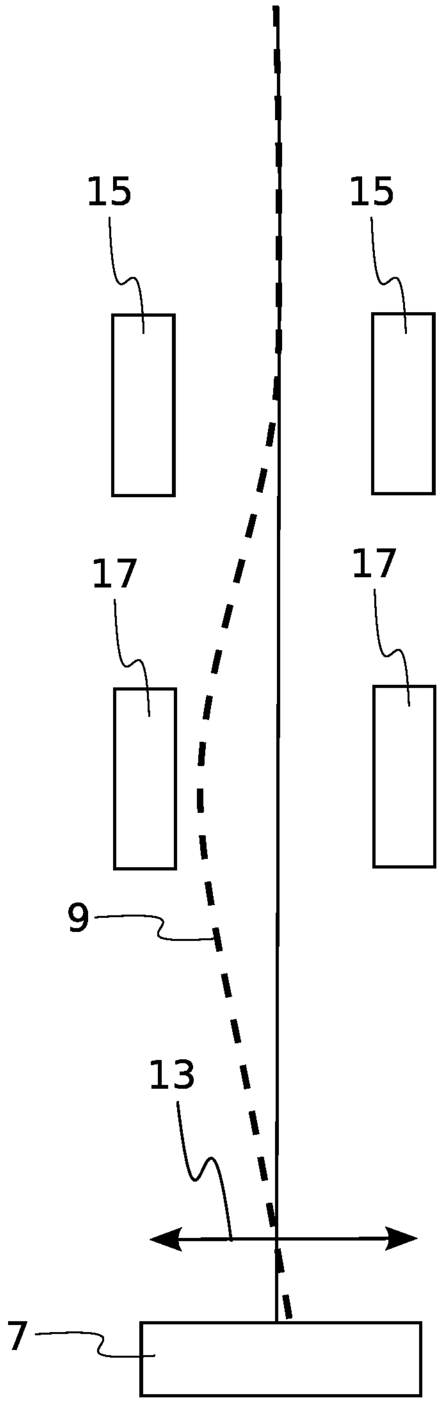
FIGS. 5*a* and 5*b* are simplified schematic cross-sectional views of a lower portion of a scanning electron microscope illustrating the effect of electron beam deflectors.
Figure 5B:
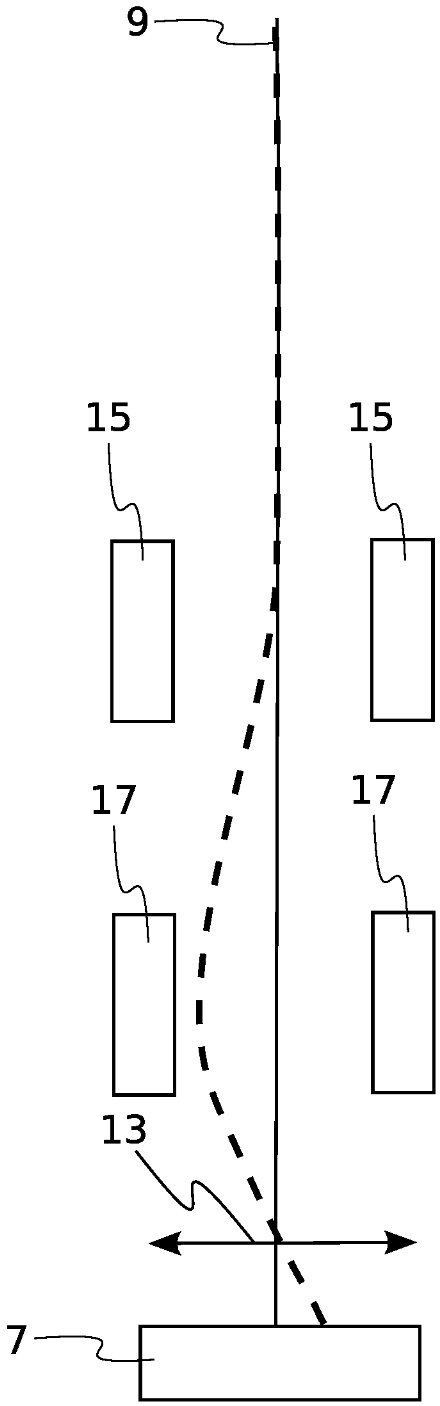
Figures 6A, 6B, 6C, 6D:
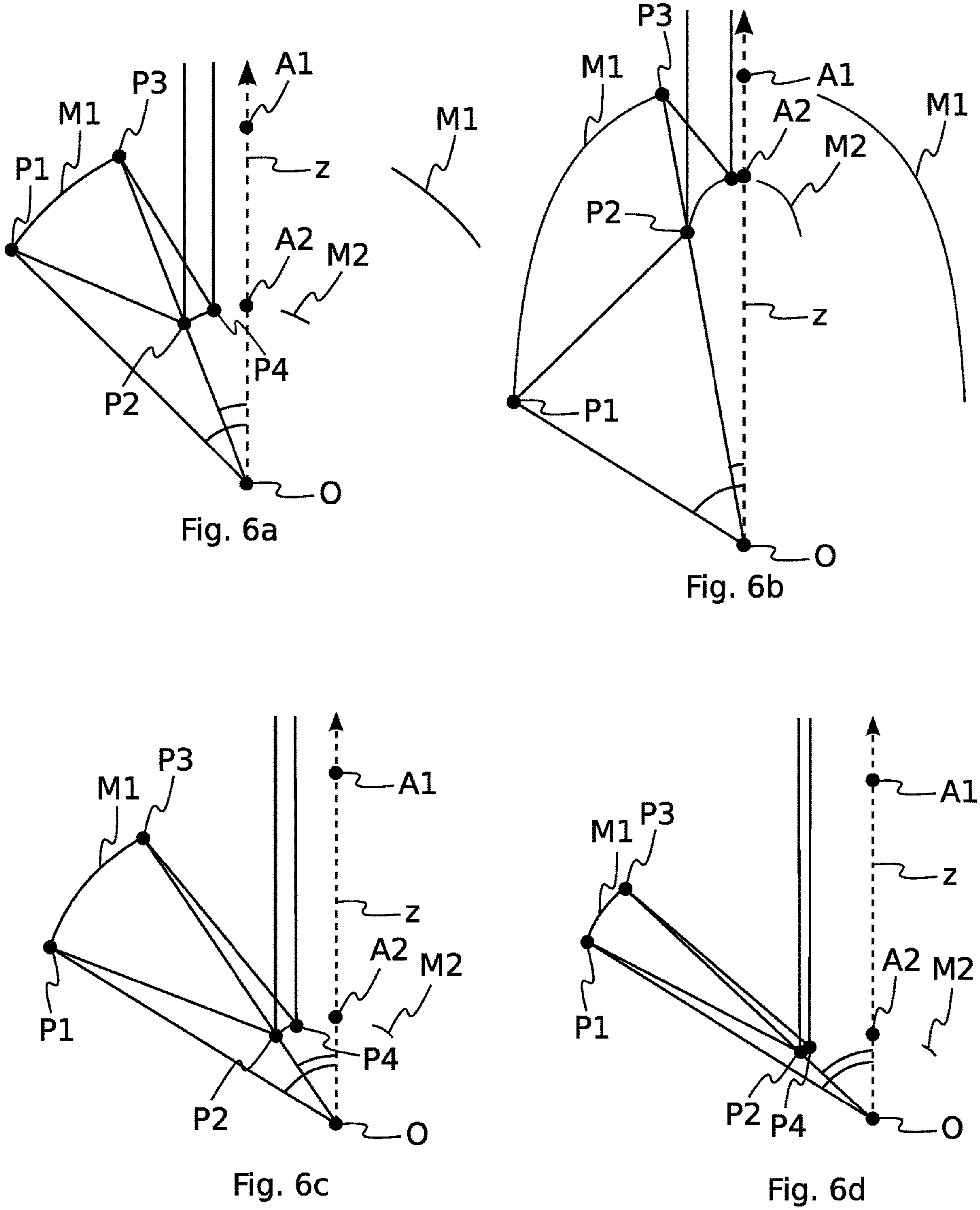
FIGS. 6*a* to 6*d* are schematic views showing various geometries of reflective objectives used in the scanning electron microscope according to the present invention.

Because of the constraints on the electromagnetic objective lens 5, and more specifically because of the large hollow interior which is required in order to allow the light to pass through, traditional electromagnetic objective lenses typically suffer from relatively strong off-axis aberrations, whereby the scanning on the sample surface deviates from the location of the optical axis of the electromagnetic objective lens. Consequently, in order to minimize such off-axis aberrations in the present invention, the scanning is designed to be carried out in such a way that the electron beam 9 intersects the electromagnetic objective lens 5 at its center, where the optical axis of the electromagnetic objective lens 5 intersects the second principal plane. In this example the second principal plane coincides with the location of the output aperture 13. This is schematically illustrated in FIGS. 5*a* and 5*b*. The second deflector 15 is arranged to deflect the electron beam 9 in one direction, while the first deflector 17 is arranged to counteract the effect of the second deflector so that the electron beam passes through the center of the electromagnetic objective lens 5. In this example, two electrostatic octupoles are used to deflect the electron beam so that it can be deflected in any direction and astigmatism corrected as well. The optimal pivot point for the electron beam 9 is obtained by varying the voltage ratio applied to the two deflectors 15, 17 and choosing for the scanning voltage that minimizes aberrations. By carefully maintaining this voltage ratio between the two deflectors 15, 17 during scanning, it is possible to maintain a fixed pivot point for the electron beam 9 at the lens center. In the example illustrated, the pivot point is at the exit aperture 13.

The further the deflectors are located from the second principal plane of the electromagnetic lens, the stronger the electric field necessary to deflect the electron beam. It is to be noted that the electron beam 9 does not normally come into contact with the deflectors 15, 17. To minimize costs and technological issues, such as better electrical isolation, cooling, expensive power supplies or slower ultimate scanning speed, which are associated with the manufacturing of high voltage deflectors, the latter are advantageously positioned as close as possible to the second principal plane of the electromagnetic objective lens 5 along the optical axis. This means that they are advantageously inserted at least partly within the reflective objective.

The position, shape and size of the deflectors 15, 17 are chosen so that the deflectors do not obstruct any light, or only part of the light emitted by the sample 7 that would in any case be obstructed by the reflective objective. The first deflector 17 is positioned within the cone of shadow generated by the second mirror M2, i.e. within the imaginary cone defined by the external diameter of the second mirror M2 and the intersection point on the sample surface where the optical axis intersects the surface of the sample. The cone of shadow may also be defined as the imaginary cone defined by the diameter of the aperture of the primary mirror M1 and the intersection point on the sample surface where the optical axis intersects the surface of the sample. Deflectors 17 are generally positioned within the cone of shadow.

In order to be able to position the two deflectors 15, 17 within the reflective objective, in this embodiment the internal radius of the second mirror M2 is designed to be large enough to accommodate the first deflector 17, and the external radius of the first mirror M1 is kept small enough so that the size and cost of the electromagnetic objective lens 5 stays reasonable. These are actually the two parameters determining the shape and dimensions of a two-mirror rotationally symmetric reflective objective. The second deflector 15 may be positioned at least partly within the aperture of the first mirror M1, or as in this embodiment, extending above the reflective objective. The second deflector 15 of this embodiment is therefore also within the cone of shadow. Consequently, deflectors 15 and 17 do not obstruct any light that may be collected by the collection objective.

The external radius of the first mirror M1 may be in the range of 40 mm to 160 mm, or in the range of 50 mm to 70 mm. In this particular example the external radius of the primary mirror is about 60 mm, which guarantees a reasonable manufacturing cost for the electromagnetic objective lens 5. The internal radius of the second mirror M2 may be in the range of 1 mm to 4 mm, or in the range of 1.50 mm to 3 mm. In this particular example the internal radius of the second mirror M2 is about 2 mm, so that a deflector having a diameter of 4 mm can be inserted in the aperture of the second mirror M2. Once the focal point has been chosen, these two constraints define uniquely the geometry of the Schwarzschild reflective objective used in the embodiments of the present invention. It is to be noted that the radial cross-section of the mirror apertures may be non-circular. If it is not circular, then the radius referred to above is understood to mean half of the largest transverse cross-sectional dimension of the aperture. The first mirror M1 has an aperture of a larger radial cross-section than the second mirror M2 so as to let the light reflected by the secondary mirror M2 pass through along the optical axis.

The first and second mirrors may be mechanically connected to each other, but in such a manner that these mechanical connectors do not obstruct any light, or at least cause minimal obstruction. For example, the second mirror M2 may be held to the first mirror M1 by a spider consisting of four very thin legs that obstruct the light as little as possible. The two mirrors and the mechanical connectors may be made of the same cast of aluminium or copper for example, so that the reflective objective is athermal, i.e. maintaining its optical performance at all temperatures, as long as it is thermalized. Aluminium and copper have the advantage that they have a high thermal conductivity and a quick thermalization. The mirrors can be coated with various reflective materials, such as metals or dielectrics in order to enhance the reflectivity over a given spectral range. Any electrical wires leading to the first and second mirrors M1, M2 are also designed such that no further light obstructions are created.

The exact geometry of a given Schwarzschild reflective objective is uniquely defined by specifying the position of one point on the surface of the first mirror M1 and one point on the surface of the second mirror M2 (relative to its focal point). In practice, it is easier to specify the position of the two mirror vertices relative to the focal point of the objective. A mirror vertex is the intersection point of the surface of a mirror (or its imaginary extension due to the mirror apertures) with the optical axis z. The shape and position of the mirrors within the Schwarzschild reflective objective may be calculated analytically or numerically. Since the calculation depends on only two parameters, e.g. the position of the two mirrors' vertices relative to the focal point of the objective, it is possible to calculate an infinite number of possible Schwarzschild objective geometries by varying these two parameters. FIGS. 6*a* to 6*d* illustrate various reflective objective geometries that may be applied. These figures are discussed next in further detail.

For practical reasons, it is not possible to collect the light emitted from the sample 7 over the full solid angle, and the collection angle is restricted to an acceptance cone of which the axis of symmetry is the optical axis z and which has a half apex angle α. Deciding upon the half apex angle α determines the numerical aperture (NA) of the Schwarzschild reflective objective, where NA is defined as NA=n× sin(α) (where n=1, as the objective is designed to stand in vacuum). In other words, the numerical aperture is defined as the sine of the maximum half collection angle α, i.e. the angle formed by the optical axis z and the most extreme collection angle.

Limiting the maximum collection angle also limits the maximum external radius of mirrors M1 and M2, as shown in FIGS. 6*a* to 6*d*. The ray emitted at the greatest half collection angle α from the focal point O will be reflected on the first mirror M1 at point P1 and on the second mirror M2 at point P2. P1 and P2 define the maximum reach of M1 and M2, respectively, as well as the overall size of the Schwarzschild reflective objective's mirrors. It can be seen that M2 obstructs some of the emitted light. As such, the light ray emitted from the focal point O and passing through P2 will be reflected on M1 at point P3 and on M2 at point P4. The point P2 defines the light ray with the smallest emission angle that can possibly be collected by the Schwarzschild objective. Any ray with a smaller emission angle (relative to the optical axis) will be obstructed by the secondary mirror M2, thus defining the cone of shadow.

The external radius is defined here as the radial distance from optical axis z to point P1 or P2. Similarly, the internal radius is defined as the radial distance from optical axis z to point P3 or P4. The surface of the first mirror M1 delimited by the optical axis and P3 (P4) is not optically active since it is shadowed by the second mirror M2. For a given numerical aperture, the overall obstruction of the second mirror M2 can be tuned by varying the positions of the two vertices. Similarly, the internal and external radii of both mirrors can be adjusted. The second minor M2 may be designed so that the half-angle β of the obstruction is smaller than 30°, and in some implementations smaller than 20° or 15°. The solid angle corresponding to the light obstruction angle (herein defined by the focal point of the reflective objective and the external diameter of the second mirror M2) is at least 0.3 steradian (sr) smaller than the solid angle corresponding to the maximal light collection angle (herein defined by the focal point of the reflective objective and the largest external diameter of the first mirror M1). This will ensure sufficient collection of the faint light of cathodoluminescence.

The fraction of light emitted at the focal point O, which is ultimately collected by the reflective objective, will not only depend on the numerical aperture of the objective, and the obstruction by the second mirror M2, it will also depend on the angular emission intensity of the emitted light. By integrating the angular emission intensity of the light collected by the reflective objective over the solid angle, it is possible to determine what fraction of the light has been collected. In many cases, the light emitted by the sample 7 at the focal point O follows a Lambertian radiation pattern and obeys Lambert's cosine law. This means that the radiant intensity observed from the surface of the sample 7 is directly proportional to the cosine of the angle α between the observer's line of sight and the normal to the surface.

The collection efficiency for a Lambertian emitter increases slowly at low numerical apertures and successively faster and faster as the numerical aperture increases (up to a numerical aperture of 0.71). If the sample 7 emits photons at a very low rate, it is important to collect as many of them as possible and to use a large numerical aperture. According to the present invention, the numerical aperture may be greater than 0.35. In some variants it is between 0.5 and 0.9, and in other variants it is between 0.6 and 0.8. In some further embodiments it is between 0.65 and 0.75. In this particular example it is 0.72 (i.e. a maximum collection angle of 45° relative to the optical axis) so that 50% of the light emitted by the Lambertian emitter can be collected. The impact of the obstruction due to the presence of the second minor M2 can be mitigated by choosing a Schwarzschild geometry for which the M2 does not cover a large solid angle. This can be done by moving the apex of the mirror M2 as close as possible to the apex of the mirror M1. In practice, the objective becomes very difficult to manufacture if both apexes are very close to each other. The level of obstruction can typically be kept below 4% of the light while keeping good manufacturability.

Figure 7:
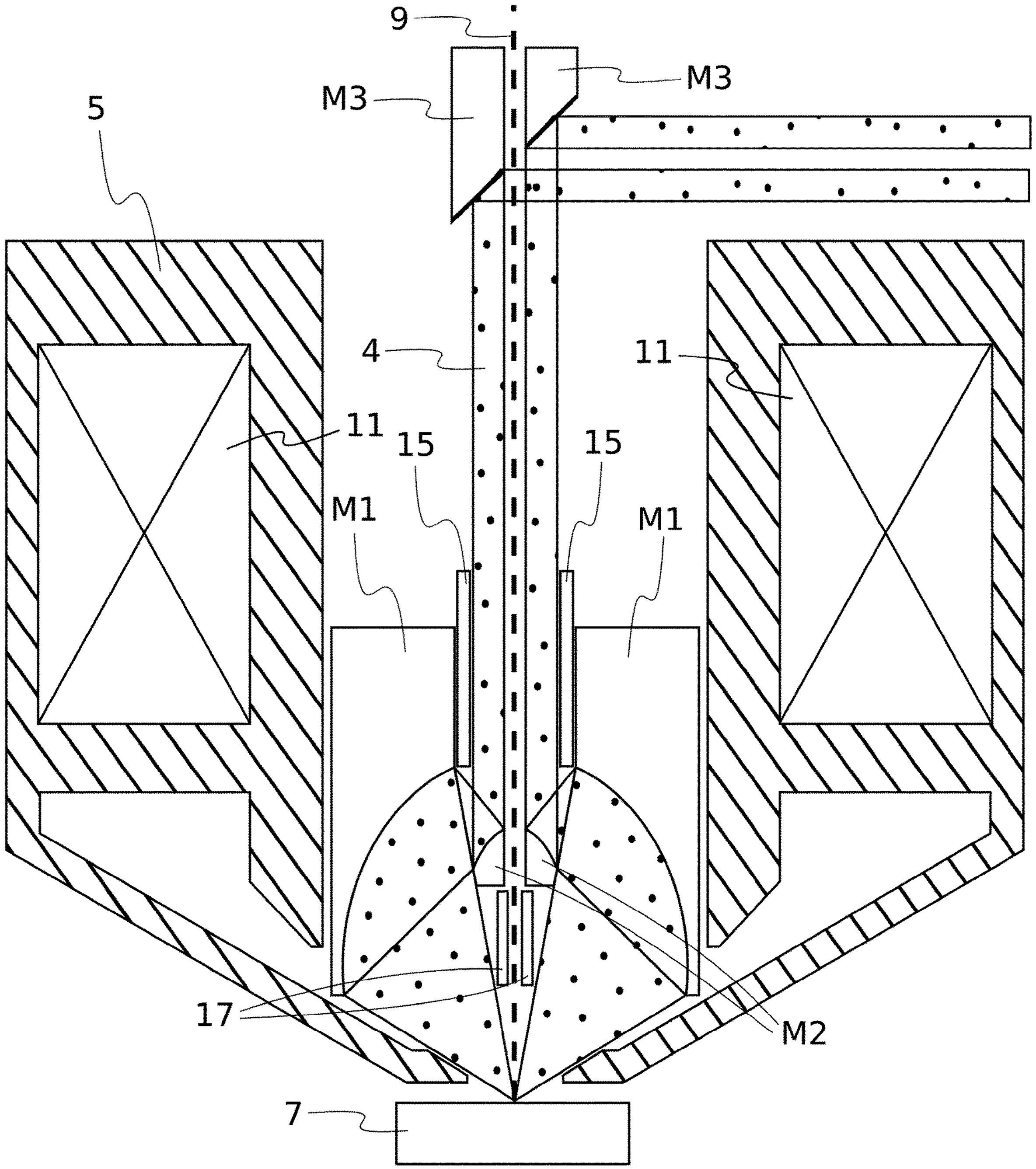
FIG. 7 is a schematic cross-sectional view of a lower portion of a cathodoluminescence scanning electron microscope according to another embodiment of the present invention.

Another embodiment is illustrated in FIG. 7. In this embodiment the geometry of the Schwarzschild reflective objective is different from the one in the other embodiments. According to this embodiment the geometry of the reflective objective corresponds to the one shown in FIG. 6*b*. As can be seen, in this embodiment the first deflector 17 is located entirely below the second mirror M2, i.e. between the second mirror M2 and the output aperture 13. Again, the deflectors 15, 17 do not create any further obstruction to the light, as the first deflector 17 is positioned within the cone of obstruction caused by the second mirror. The cone of obstruction may be defined by the angle between the optical axis of the electromagnetic objective and the ray of light emitted from the sample and reaching the innermost reflective surface of the first mirror M1, i.e., an imaginary line drawn from the point of impingement of the electron beam on the sample and the interior diameter of the aperture of the first mirror M1. The deflectors 17's position can also be defined as being within the imaginary cone extending from the aperture of mirror M1 to the focal point of the electromagnetic coil 11, which is also the point of impingement of the electron beam on the sample. So long as the deflectors 17 are positioned within this imaginary cone, the deflectors will not interfere with light collection.

In the disclosed embodiments the first deflector 17 is located inside a volume region axially located between the first central aperture and the focal plane, and within the solid angle subtended by the first central aperture at a point of intersection between the focal plane of the electromagnetic objective lens and the optical axis of the electromagnetic objective lens. The optical axis of the electromagnetic objective lens may substantially coincide with the optical axis of the reflective objective. Thus, the optical axis may be the axial center of rotation of the electromagnetic objective lens. It is to be noted that solid angle is not limited to the shape of a cone.

Figure 8:
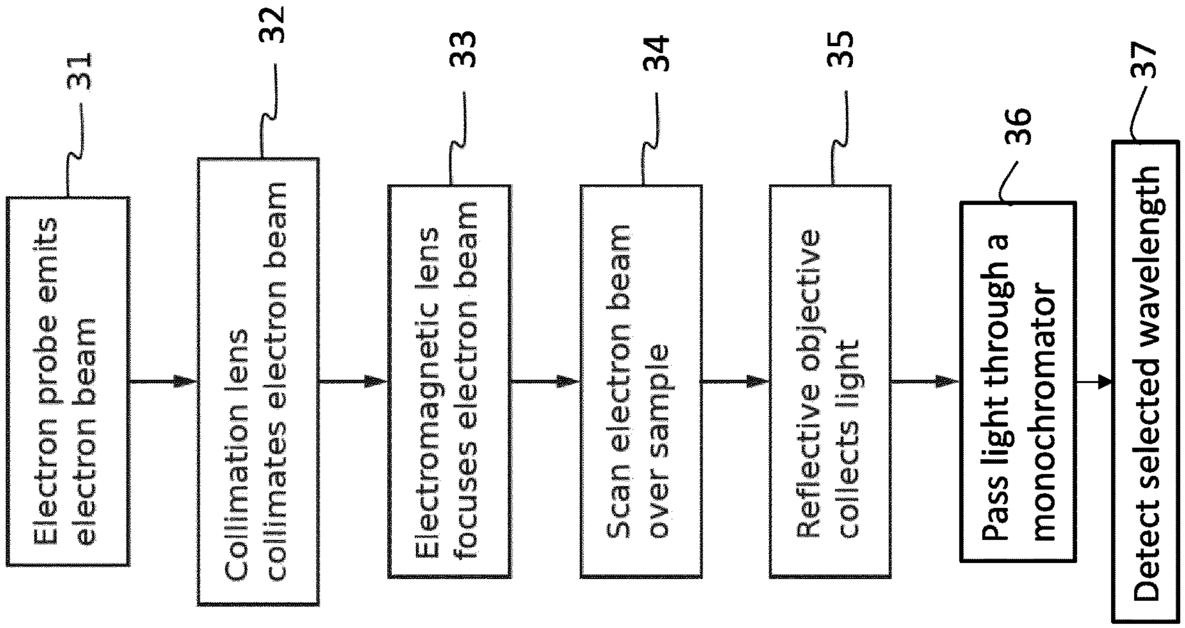
FIG. 8 is a flow chart illustrating a method of operating a scanning electron microscope according to one example of the present invention.

The flow chart of FIG. 8 summarizes the method of operating the scanning electron microscope according to one example, wherein some or all of the recited steps may occur simultaneously or at any other desired order. In step 31 the electron emitter 1 or probe generates a pulsed electron beam 9. In step 32 the electron beam produced by the electron emitter is transformed into a collimated, focused or divergent electron beam by means of a collimating lens 5' located in the trajectory of the electron beam 9. In step 33 the electromagnetic objective lens 5 generates a magnetic field at an output aperture 13 of the electromagnetic objective lens 5 for focusing the electron beam to a sample 7. In step 34 the deflectors 15, 17 deviate the electron beam 9, thus enabling it to perform a scan over the sample 7. In step 35 the reflective objective, mounted axially along the electron beam 9 and within the electromagnetic objective lens 5, collects light from the sample 7. The light collected from the sample is redirected to the third mirror M3, which further redirects the light out of the vacuum enclosure 10. In step 36 the collected light is passed through a monochromator to spatially separate the light into its wavelengths components. In step 37 the intensity of light at a selected wavelength is detected.

Returning to FIG. 4, the light reflected by mirror M3 is focused by lens 22 onto an imaging monochromator 43. In this example, two imagers are provided, a CCD camera 45 and a detector 46, such as an InGaAs or PMT detector. If mirror 24 is a half mirror, then both imagers can be operated simultaneously. Conversely, mirror 24 may be a flip mirror, enabling one imager at a time. With this arrangement, detector 46 can be used to detect light intensity of a specified wavelength, while CCD camera may be used to detect light intensity at several wavelengths simultaneously.

In order to generate a light image of the sample, light source 26 may be operated to generate a light beam that is reflected by flip mirror 27 onto the lens 22, and thence to mirror M3 towards the sample via mirrors M2 and M1, wherein reflected light would travel the reverse path into the CCD camera. In this mode of operation, the mirror arrangement comprising the three mirrors M1, M2 and M3 is used to direct light to the sample 7 from light source 26 and to collect the light reflected from the sample 7 and direct it towards the CCD detector 45.

In the embodiment of FIG. 4, an electron detector 19 is provided, to be able to detect secondary electrons emitted from the sample, or back scattered electrons reflected by the sample. The signal of this detector can be used to generate a scanning electron microscope (SEM) image. Also, in the embodiment of FIG. 4, the sample holder 47 is in the form of a cryogenic stage, which keeps the sample at low temperatures thereby avoiding noisy light emissions.

The embodiments disclosed herein encompass an electromagnetic lens comprising: a housing having an entry aperture at top surface thereof and an exit aperture at bottom thereof; an electromagnetic coil radially positioned within the housing; light collection optical elements positioned within the housing; and electron beam deflector positioned within the housing; wherein the light collection optical elements comprise a concave mirror having a first axial aperture; and a convex mirror having a second axial aperture; and the electron beam deflector comprises a first set of deflectors positioned at least partially within the first axial aperture and a second set of deflectors positioned below the first set of deflectors.

Disclosed embodiments provide an electron microscope generating an electron beam image, a light beam image, a cathodoluminescence (CL) image, and a CL spectrographic image, comprising: a vacuum enclosure; an electron source positioned at a top position within the vacuum enclosure; an electromagnetic objective lens positioned at a bottom position within the vacuum enclosure, the electromagnetic objective lens including a housing having an entry aperture at top surface thereof and an exit aperture at bottom thereof; an electromagnetic coil radially positioned within the housing; a light objective positioned within the housing and comprising a concave mirror having a first axial aperture and a convex mirror having a second axial aperture; an electron beam deflector positioned within the housing and comprising a first set of deflectors and a second set of deflectors cooperating to scan the electron beam over a specimen; a deflector mirror receiving light collected by the light objective and deflecting the light towards outside of the vacuum enclosure; a light source generating a light beam towards the deflector mirror; an electron sensor position to detect electrons emitted from the specimen; an imaging sensor; an imaging monochromator splitting the light collected by the light objective into different wavelengths; and a controller receiving output signal from the electron sensor and generating therefrom an electron image, receiving output signal from the imaging sensor and generating therefrom a light image, receiving output signal from the imaging monochromator and generating therefrom cathodoluminescence (CL) image and CL spectrographic images.

The embodiments disclosed provide a scanning electron microscope, comprising: an electron emitter for providing an electron beam (9); an electromagnetic objective lens (5) arranged to generate a magnetic field for focusing the electron beam to a focal plane of the electromagnetic objective lens (5) substantially perpendicular to an optical axis of the electromagnetic objective lens; first electron beam deviating means (17) for deviating the electron beam (9) in order to scan the electron beam (9) over a sample (7); and a reflective objective arranged around the path of the electron beam (9) within the electromagnetic objective lens (5) for collecting light from the sample (7) or for focusing light to the sample (7), the reflective objective comprising a first mirror (M1) within a first distance from an output aperture (13) of the electromagnetic objective lens (5), and a second mirror (M2) within a second distance from an output aperture (13), the first distance being greater than the second distance, the first mirror (M1) and the second mirror (M2) having a first central aperture and a second central aperture, respectively, for enabling the electron beam (9) to pass through the first and second mirrors (M1, M2), wherein the first electron deviating means (17) is located inside a volume region axially located between the first central aperture and the focal plane, and within the solid angle subtended by the first central aperture from a point of intersection of the focal plane of the electromagnetic objective lens with the optical axis of the electromagnetic objective lens (5). The first electron deviating means (17) may be located radially inwards from the second central aperture and the first electron deviating means (17) may be located coaxially with the second central aperture. The first electron deviating means (17) may be axially located between the second mirror (M2) and the output aperture (13) of the electromagnetic objective lens (5).

The microscope may further comprise a second electron beam deviating means (15) for deviating the electron beam (9), and axially located between the first electron beam deviating means (17) and the electron emitter.

The electromagnetic objective lens (5) nay have an optical axis perpendicular to the magnetic field, wherein the first electron beam deviating means (17) and the second electron beam deviating means (15) are arranged to scan the electron beam so that the electron beam (9) passes through the optical axis within the electromagnetic field generated by the electromagnetic objective lens (5).

The electromagnetic objective lens (5) may have a first principal plane and a second principal plane, and one of the first and second principal planes being arranged to focus the electron beam (9), and wherein the first electron beam deviating means (17) and the second electron beam deviating means (15) are arranged to scan the electron beam so that the electron beam (9) passes through the optical axis at the principal plane arranged to deflect the electron beam (9).

The second electron beam deviating means (15) may be located coaxial with and radially inwards from the first central aperture.

The reflective objective may be aplanatic and may be a Schwarzschild or a Head reflective objective. Also, the electromagnetic objective lens (5) and the reflective objective may have the same focal plane.

The numerical aperture NA of the reflective objective, defined by $NA=n\times\sin(\alpha)$, where $\alpha$ is the half-angle of the maximum cone of light that can enter or exit the first mirror (M1) and n is the index of refraction of the medium in which the reflective objective is located, may be at least 0.35 or at least 0.7.

The largest radial dimension of the second central aperture may be between 2.5 mm and 12 mm.

The half-angle ($\beta$) of the solid angle defined by the focal point of the reflective objective and the largest external dimension of the second mirror (M2) may be at most 20 degrees.

The microscope may further comprise an electron beam shaping means for shaping the electron beam (9) from the electron emitter before reaching the electromagnetic objective lens (5).

The solid angle defined by the focal point of the reflective objective and the largest external dimension of the second mirror (M2) may be at least 0.3 steradian (sr) smaller than the solid angle defined by the focal point of the reflective objective and the largest external dimension of the first mirror (M1).

Also, a method of operating a scanning electron microscope is provided, comprising: energizing an electron emitter to thereby generate an electron beam (9); energizing an electromagnetic objective lens (5) to thereby generate a magnetic field for focusing the electron beam to a focal plane of the electromagnetic objective lens (5) substantially perpendicular to an optical axis of the electromagnetic objective lens; energizing a first electron beam deviating means (17) thereby deviating the electron beam (9) in order to scan the electron beam (9) over a sample (7); and, arranging a reflective objective around the path of the electron beam (9) within the electromagnetic objective lens (5) for collecting light from the sample (7), the reflective objective comprising a first mirror (M1) within a first distance from an output aperture (13) of the electromagnetic objective lens (5), and a second mirror (M2) within a second distance from an output aperture (13), the first distance being greater than the second distance, the first mirror (M1) and the second mirror (M2) having a first central aperture and a second central aperture, respectively, for enabling the electron beam (9) to pass through the first and second mirrors (M1, M2), wherein the first electron deviating means (17) is located inside a volume region axially located between the first central aperture and the focal plane, and within the solid angle subtended by the first central aperture from a point of intersection of the focal plane of the electromagnetic objective lens with the optical axis of the electromagnetic objective lens (5).

While the invention has been illustrated and described in detail in the drawings and foregoing description, such illustrations and descriptions are to be considered illustrative or exemplary and not restrictive, the invention being not limited to the disclosed embodiments. Other embodiments and variants are understood, and can be achieved by those skilled in the art when carrying out the claimed invention, based on a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. An electromagnetic objective lens comprising:
- a housing having an entry aperture at top surface thereof and an exit aperture at bottom thereof;
- an electromagnetic coil radially positioned within the housing;
- light collection optical elements positioned within the housing and comprising a concave mirror having a first axial aperture and a convex mirror having a second axial aperture;
- an electron beam deflector positioned within the housing and comprising a first set of deflectors and a second set of deflectors positioned below the first set of deflectors, wherein the second set of deflectors is positioned within an imaginary cone extending from the first axial aperture to a focal point of the electromagnetic coil.

2. The electromagnetic objective lens of claim 1, wherein the second set of deflectors is positioned at least partially within the second axial aperture.

3. The electromagnetic objective lens of claim 1, wherein the second set of deflectors is positioned below the convex mirror.

4. The electromagnetic objective lens of claim 1, wherein the second set of deflectors is positioned within a cone of obstruction of the convex mirror.

5. The electromagnetic objective lens of claim 1, wherein the first set of deflectors is positioned at least partially within the first axial aperture.

6. The electromagnetic objective lens of claim 5, wherein the second set of deflectors is positioned at least partially within the second axial aperture.

7. The electromagnetic objective lens of claim 5, wherein the second set of deflectors is positioned below the convex mirror.

8. The electromagnetic objective lens of claim 1, wherein the first set of deflectors comprises one of quadrupole or octupole and the second set of deflectors comprises one of quadrupole or octupole.

9. The electromagnetic objective lens of claim 1, wherein the light collection optical elements comprise a Schwarzschild reflective objective.

10. The electromagnetic objective lens of claim 1, wherein the light collection optical elements comprise a reflective objective that is aplanatic and infinity-corrected.

11. The electromagnetic objective lens of claim 1, further comprising stigmators positioned within the electromagnetic objective lens.

12. The electromagnetic objective lens of claim 1, further comprising connectors mechanically attaching the convex mirror to the concave mirror.

13. The electromagnetic objective lens of claim 1, wherein a solid angle defined by a focal point of the light collection optical elements and outer diameter of the convex mirror is at least 0.3 steradian smaller than a solid angle defined by the focal point of the light collection optical elements and outer diameter of the concave mirror.

14. A scanning electron microscope comprising:
- a sample holder;

an electron column positioned to direct an electron beam downwards onto a sample positioned on the sample holder; and, a light imager situated to receive a light beam from the electron column;

wherein the electron column comprises:

a vacuum enclosure;

an electron source;

an electromagnetic objective lens positioned within the vacuum enclosure, the electromagnetic objective lens including a housing having an entry aperture at top surface thereof and an exit aperture at bottom thereof;

an electromagnetic coil radially positioned within the housing;

a light objective positioned within the housing and comprising a concave mirror having a first axial aperture and a convex mirror having a second axial aperture;

an electron beam deflector positioned within the housing and comprising a first set of deflectors and a second set of deflectors positioned below the first set of deflectors, wherein the second set of deflectors is positioned below the first axial aperture and the first set of deflectors is positioned above the second set of deflectors.

15. The scanning electron microscope of claim 14, wherein the light imager comprises an imaging monochromator positioned outside the vacuum enclosure and a light sensor positioned to receive light from the imaging monochromator.

16. The scanning electron microscope of claim 15, wherein the sample holder comprises a cryogenic stage.

17. The scanning electron microscope of claim 16, wherein the electron source comprises a pulsed electron source.

18. The scanning electron microscope of claim 14, wherein the first set of deflectors is positioned at least partially within the first axial aperture.

19. The scanning electron microscope of claim 18, wherein the second set of deflectors are positioned at least partially within the second axial aperture.

20. The scanning electron microscope of claim 14, wherein the second set of deflectors is positioned within an imaginary cone extending from the first axial aperture to a focal point of the electromagnetic coil.

21. The scanning electron microscope of claim 14, further comprising connectors mechanically attaching the convex mirror to the concave mirror.

22. The electromagnetic objective lens of claim 14, wherein a solid angle defined by a focal point of the light objective and outer diameter of the convex mirror is at least 0.3 steradian smaller than a solid angle defined by the focal point of the light collection optical elements and outer diameter of the concave mirror.

* * * * *